United States Patent
Clark et al.

[11] Patent Number: 5,972,765
[45] Date of Patent: Oct. 26, 1999

[54] USE OF DEUTERATED MATERIALS IN SEMICONDUCTOR PROCESSING

[75] Inventors: William F. Clark; Thomas G. Ference, both of Essex Junction; Terence B. Hook, Jericho Center; Dale W. Martin, Hyde Park, all of Vt.

[73] Assignee: International Business Machines Corporation, Armonk, N.Y.

[21] Appl. No.: 08/895,049

[22] Filed: Jul. 16, 1997

[51] Int. Cl.⁶ .................................. H01L 21/336
[52] U.S. Cl. .................... 438/308; 438/592; 438/795
[58] Field of Search ..................... 438/308, 795

[56] References Cited

U.S. PATENT DOCUMENTS 5,711,998  1/1998  Shufflebotham .
5,872,387  2/1999  Lyding et al. .

FOREIGN PATENT DOCUMENTS

WO 94/19829  2/1994  WIPO .
WO 97/26676  7/1997  WIPO .

OTHER PUBLICATIONS

C. Savall, et al.,Hydrogen and deuterium migration in annealed plasma–deposited silicon nitride films, 1995, Elsevier Science SA, pp. 1–4.

J.W. Lyding and K. Hess, Reduction of hot electron degradation in metal oxide semiconductor transistors by deuterium processing, Apr. 29, 1996, Appl. Phys. Lett. 68(18), pp. 2526–2528.

I.C. Kizilyalli, et al., Deuterium Post–Metal Annealing of MOSFET's for Improved Hot Carrier Reliability, Mar. 1997, IEEE Electron Device Letters, vol. 18 No. 3, pp. 81–83.

Hishashi Fukada, et al., Effect of Deuterium Annel in SiO2/Si(100) Interface Traps and Electron Spin Resonance Signals of Ultrathin SiO2 Films, Apr. 15, 1993, Jpn. Appl. Phys. vol. 32, pp. 569–571.

Chris G. Van de Walle, et al., Comment on "Reduction of hot electron degradation in metal oxide semiconductor transistors by deuterium processing", Oct. 14, 1996, Appl. Phys. Lett. 68 p. 2526, 69 (16) p. 2441.

S.S. He, et al., Hydrogen Bond Configuration Changes in PECVD Silicon Nitride Films During RTA, 1995, Materials Research Society, Mat. Res. Soc. Symp. Proc. vol. 377, pp. 337–343.

G. Stevens, et al., Bonding of Hydrogen and Deuterium in Silicon Nitride Films Prepared by Remote Plasma Enhanced Chemical Vapor Deposition, 1995, Materials Research Society, Mat. Res. Soc. Symp. Proc. vol. 377, p. 313–319.

James Dunkley, et al., Hot Electron Induced Hydrogen Compensation of Boron Doped Silicon Resulting From Emitter–Base Breakdown, 1992, IEEE p. 750–788.

D.A. Buchanan, et al., Hot–electron–induced hydrogen redistribution and defect generation in metal–oxide–semiconductor capacitors, Sep. 15, 1994, J. Appl. Phys. 76 (6), pp. 3595–3608.

(List continued on next page.)

*Primary Examiner*—John F. Niebling
*Assistant Examiner*—Jonathan Hack
*Attorney, Agent, or Firm*—Whitham, Curtis & Whitham; James M. Leas

[57] ABSTRACT

Method of forming a film for a semiconductor device in which a source material comprising a deuterated species is provided during formation of the film.

35 Claims, 3 Drawing Sheets

OTHER PUBLICATIONS

W.M. Arnoldbik, et al., Dynamic behavior of hydrogen in silicon nitride and oxynitride films made by low–pressure chemical vapor deposition, 1993, The American Physical Society, vol. 48 (8), pp. 5444–5456.

Masakazu Nakabayashi, et al., Influence of Hydrogen on Electrical Characteristics of Poly–Si Resistor, 1993, Jpn. Appl. Phys. vol. 32, pp. 3734–3738.

J. Zhao, et al., Observation of electromigration of hydrogen in polycrystalline silicon using poly emitter bipolar transistors, 1993, Appl. Phys. Lett. vol. 62 (23), p. 2950–2952.

Wang, et al., Highly Reliable Silicon–Nitride Films Made by Jet Vapor Deposition, Jap Soc. Appl. Physics, Reprinted from Ext. Abstracts of 1994 Int'l Conf. on Solid State Devices of Mat'ls, pp. 856–858.

Devine, et al., Appl. Phys. Lett. vol. 70 (22), Jun. 2, 1997, pp. 2999–3001, Abstract only.

Shinichi Yoshioka, et al., A Radiation–Hardened 32–bit Microprocessor Based in the Commercial CMOS Process, 1994, IEEE Transactions on Nuclear Science, vol. 41 (6), pp. 2481–2486.

Ghandhi, VLSI Fabrication and Principles Silionc and Gallium Arsenide, Second Edition, 732, 733, 1994.

USE OF DEUTERATED MATERIALS IN SEMICONDUCTOR PROCESSING

BACKGROUND OF THE INVENTION

1. Field of the Invention

The present invention generally relates to the field of semiconductor device fabrication, and more particular, to usage of deuterated materials in semiconductor device processing.

2. Description of the Related Art

Electronic devices, such as metal oxide semiconductor (MOS) transistors, used in VSLI integrated circuits experience a number of wear out mechanisms that limit the degree to which they can be miniaturized (scaled). One of these mechanisms is the so-called hot (energetic) electron effect.

For instance, in thermally oxidized silicon, such as gate oxide formed on a silicon substrate, it is possible for electrons (or holes) generated in the silicon substrate by device action to escape from the silicon and become injected into and be trapped in the adjoining silicon oxide. Depending on the use conditions and the details of the structure of the source and drain diffusions of a MOSFET device, there will be more or fewer electrons of greater or lesser energy generated in the silicon substrate and injected into the gate oxide.

The trend in VSLI device design has been towards increased electric field (both vertical and horizontal), which aggravates hot electron effects. Among other things, the hot electron effects result in a slow, long-term change in the threshold voltage, as well as a reduction in the transconductance of MOSFET devices. Hot electron effects also can give rise to the known phenomenon of deterioration in the low-level current gain of bipolar transistors whose emitter-base junctions have been subjected to avalanche breakdown.

The accepted theory on how the hot electrons cause damage to the silicon/silicon oxide interface is that the hot electrons stimulate desorption of hydrogen from the silicon/silicon oxide interface by breaking some of the Si—H bonds present on the silicon surface, leading to an increase in interface trap density and a degradation in device performance. The hydrogen is present at the interface after being introduced into the device as result of semiconductor processes such as post-metallization anneals of wafers conducted at low temperatures in hydrogen ambient, which improve device function by passivation of crystal defects at the silicon/silicon oxide interface. The term "passivation" means that the hydrogen satisfies dangling bonds at the silicon/silicon oxide interface. However, the Si—H passivation bonds formed at the silicon/silicon oxide interface during such annealing processes are susceptible to dissociation by hot electron excitation.

It has recently been found that the hot electron effect may be mitigated by replacing deuterium (D) for hydrogen used in the passivation of the interface traps at the silicon/silicon dioxide interface. (J. W. Lyding et al., *Appl. Phys. Lett.* 68 (18), Apr. 29, 1996, pp. 2526–2528; and I. C. Kizilyalli et al., *IEEE Electron Device Letters,* vol. 18, No. 3, March 1997, pp. 81–83.) The element hydrogen has three known isotopes:
ordinary hydrogen, or protium, $^1_1H$; heavy hydrogen, or deuterium, $^2_1H$; and tritium, $^3_1H$. Lyding et al. and Kizilyalli et al. teach that the deuterium isotope accumulates at the silicon/silicon dioxide interface during post-metal anneal processes, such as is done in a deuterated forming gas ($D_2/N_2$) at a temperature of 400° C. The resulting silicon-deuterium (Si—D) bonds formed at the silicon/silicon dioxide interface are found to be more resistant to dissociation from hot electron excitation stresses than a Si—H bond.

The present investigators, however, have determined that deuterium incorporated into a silicon/silicon dioxide interface for passivation by anneal processes tends to drift away from the interface as a result of subsequent thermal cycling incurred in the further processing of the semiconductor device, even where only relatively moderate temperatures, such as about 400° C., are involved. In particular, the present investigators have confirmed with secondary-ion-mass spectroscopy (SIMS) data that deuterium incorporated at the silicon/silicon dioxide interface can and does migrate away from the interface during subsequent processing of the sort which effectively "anneals" the wafer as the intended objective or as an incidental effect of a different process, such as film deposition. Therefore, any potential performance enhancements imparted by the deuterium anneal of the prior art were evanescent in nature based on what the present investigators have determined. For purposes of this application, the term "anneals", and variants thereof, means subjecting a semiconductor wafer to at least one thermal cycle in which it is heated and thereafter cooled.

Therefore, problems remained unresolved in the prior art with respect to semiconductor processing involving hydrogen-containing reactants and ambients which tended to cause silicon/silicon dioxide interface disruption.

SUMMARY OF THE INVENTION

It is an object of the present invention to provide unique approaches for introducing deuterium into silicon/silicon dioxide interfaces of semiconductor devices.

It is another object of the present invention to provide a technique for protecting and preserving the deuterated state of deuterated materials once formed in a semiconductor device to enable the deuterated materials to better tolerate and survive any subsequent thermal cycling of the device.

It is one specific object of the present invention to provide a technique that protects and preserves the deuterated state of a previously deuterated-silicon/silicon dioxide interface imparted by a post-metal anneal process to enable the deuterated materials to withstand subsequent thermal cycling of the device.

It is yet another object of the present invention to replace hydrogen content otherwise introduced into various semiconductor features located near the gate oxide in an FET device to avoid opportunities for hydrogen, if otherwise present, to migrate from such other device elements into the silicon/silicon dioxide interface where it could exacerbate damage from hot electron effects.

The foregoing and other objects of the invention are achieved by the present invention.

In one embodiment of the invention, the hydrogen content of film-forming reactants used in semiconductor manufacture is replaced with deuterium to create deuterated film materials in situ during the formation of the films. In one implementation, gate oxide is formed by a unique technique of pyrogenic wet oxidation using deuterium-based chemical species. Further, other film elements of the semiconductor device such as the gate, gate sidewall spacers, and nitride barrier film and so forth, in addition to the gate oxide, which otherwise would be formed with hydrogen based reactants also have deuterium substituted for the hydrogen. As a consequence, there is no source of hydrogen available to replace deuterium passivating the silicon/silicon dioxide interface and a large reservoir of deuterium is made available within the device itself to supply deuterium to the silicon/silicon dioxide interface as needed should the passivating deuterium be thermally detrapped during subsequent processing.

In another embodiment of the invention, an improved post-metal anneal process for semiconductor devices is provided in which the beneficial effect of a deuterium anneal on the silicon/silicon dioxide interface is effectively "sealed in" and protected from further processing. In this embodiment, a deuterium anneal is first performed to incorporate deuterium at the silicon/silicon dioxide interface of a transistor device made by conventional processing up to that point, and then the device is sealed by forming a high deuterium concentration reservoir layer on the device. In a further optional step, a diffusion barrier film, such as a jet vapor deposited nitride or a low hydrogen nitride made with nitrogen and silane, is formed on the high deuterium concentration reservoir layer. The deuterium nitride barrier layer having a low hydrogen density helps seal in the beneficial effects of the deuterium and allows further thermal anneals and processing in hydrogen to take place in the back-end-of-line (BEOL) processing of the semiconductor device without exchanging the deuterium with hydrogen.

In another refinement of the invention, low temperature processing, viz., processing at or below 400° C., is employed after the deuterium processing to help keep the deuterium at the silicon/silicon dioxide interface. The avoidance of thermal disturbances in this manner reduces the incidence of replacement of hydrogen for deuterium.

The invention makes the total processing environment for semiconductor devices more robust by providing deuterated sources for the materials used in processes which effect "annealing" of the wafers both to insure that less deuterium is lost from the annealed device and also by insuring that any hydrogen reservoirs in the films are instead populated with deuterium.

While conventional semiconductor processing involving hydrogen-containing reactants and ambients tends to cause silicon/silicon dioxide interface disruption, the present invention instead stabilizes such interfaces. Namely, the deuterated device films made according to this invention are more resistant to degradation at the silicon/silicon dioxide interface from hot electron effects. This provides improved retention of high device performance over the life of the semiconductor device, and it enables the semiconductor device to go to higher speeds with higher currents without experiencing hot electron effect damage problems. That is, more current can be pushed through the device containing deuterated films according to this invention, or, alternatively, less silicon/silicon dioxide interface damage is sustained with the same current. Also, by reducing the guardband or margin required by the hot electron effect, fabrication costs can be reduced significantly by virtue of higher speed sorting.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

In a first embodiment of this invention, films are originally formed bearing a large amount of deuterium in the fabrication of the semiconductor device. Two effects follow: there is no source of reactive hydrogen to replace the deuterium already passivating the interface; and a large reservoir of deuterium is made available to supply deuterium to the silicon/silicon dioxide interface in the event passivating deuterium becomes thermally detrapped during subsequent processing. Also, processing temperatures for forming many of the films in semiconductor devices are high enough (i.e., >400° C.) to depassivate the silicon/silicon dioxide interface and create a deuterium/hydrogen exchange mechanism. Therefore, using $D_2$ in the processing ambient during the initial part of the material deposition passivates states that have lost deuterium while heating up to the processing temperature.

More specifically, in the first embodiment of this invention, hydrogen-containing materials used as film formation reactants and species in semiconductor fabrication, which affect the hydrogen content and processing background, are modified to instead use their deuterated analogs during the formation of the films. Such a class of materials, includes, for example, deuterium oxide ($D_2O$) used in wet oxidation systems, or deuterated silane ($SiD_4$), dichlorosilane ($SiCl_2D_2$), and ammonia ($ND_3$) used to provide films by chemical vapor deposition (CVD) processes. These deuterated materials are used in one or more of the depositions of components such as gate oxides, polysilicon gates, sidewall spacers, barrier nitrides, and even oxide passivation films, and so forth. An overarching principle of this embodiment is the identification of film processes which provide either a hydrogen-containing environment which "anneals" the wafers as a by-product of the deposition or which provide a reservoir of hydrogen which may be driven into the gate oxides during subsequent processing. Applicable processes would also be defined as those occurring before formation of a deuterated passivation nitride which blocks hydrogen diffusion from any subsequently formed films into the gate oxide, although the processing of oxide passivation films also can be encompassed by this invention where the barrier nitride layer is not deuterated. Economical considerations or supply considerations may restrict the number of these device layers which can be deuterated according to the invention, i.e., deuterium and deuterium compounds currently are costly and/or availability is limited. Ideally, as many of these layers that otherwise would be formed with or in the presence of hydrogen would instead be deuterated to enhance the overall effect, although emphasis on deuterating the gate oxide and silicon nitride barrier layers is thought most important at this point to subdue hot electron effects and inhibit migration of deuterium and hydrogen away from their original incorporation sites in the device.

Figure 1:
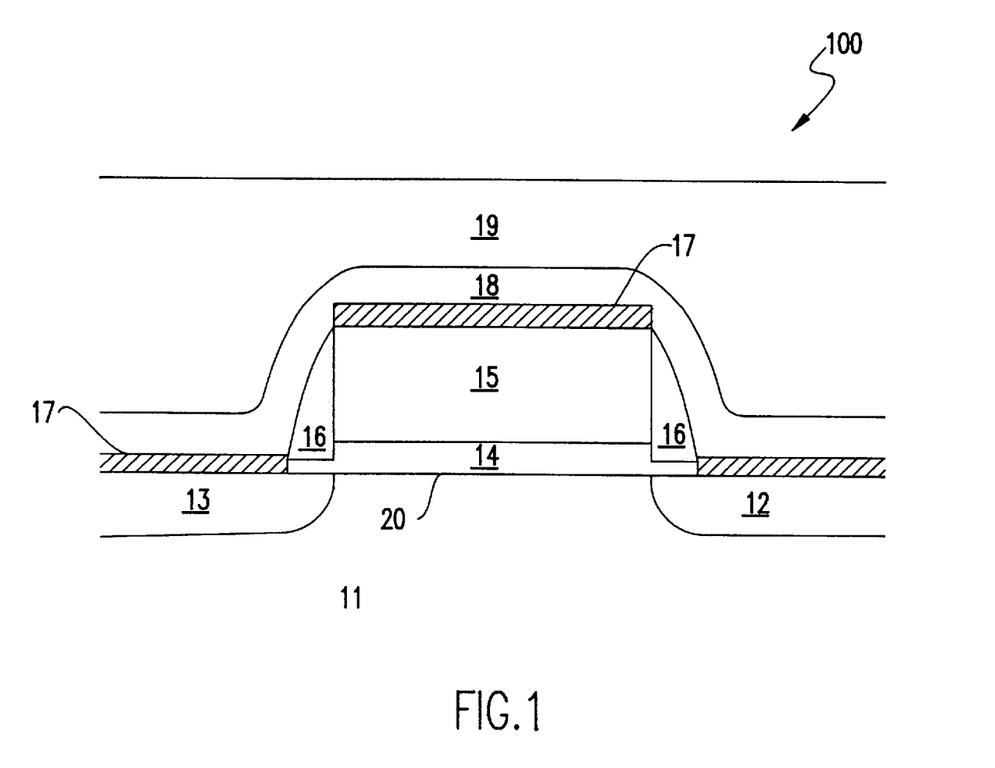
FIG. 1 illustrates in cross-sectional view of a MOSFET device having various deuterated films incorporated therein according to the present invention.

Referring to the MOSFET device 100 illustrated in FIG. 1 having a silicon substrate 11 and source/drain regions 12 and 13, films that can be addressed by this embodiment include the gate oxide 14, the gate polysilicon 15, the sidewall spacer 16, the barrier silicon nitride layer 18, and the deposited oxide passivation layer 19 (e.g., $SiO_2$, PSG, BSG, BPSG). A self-aligned silicide layer 17 can be provided on the gate 15 and source/drain regions 12/13 by conventional methods prior to forming barrier silicon nitride 18. The silicon substrate, preferably a monocrystalline silicon material, can be p-type or n-type with well implants provided as appropriate for the ultimate desired type of FET operation. Isolation processing and well implants, of any conventional variety, would be used for the device, but these aspects are not depicted in FIGS. 1–3 for sake of clarity as they do not specifically form part of the present invention.

An important objective of the present invention is to significantly curb if not prevent damage by hot electron effects at the silicon/silicon dioxide interface 20.

Conventional silicon oxidation systems that use a hydrogenated reactant are generally useful in the present invention to form silicon dioxide (silica) films that incorporate deuterium, for instance, to produce gate oxide 14 on a semiconductor substrate. Wet oxidation processes using water and CVD systems using silane can be adapted according to the present invention to provide deuterated silicon dioxide films on silicon.

As one specific application of this first embodiment of the invention, a 'wet oxidation' process is used to produce gate oxide 14 on a semiconductor substrate. Water, HCl, and TCA are among the gases used in conventional wet oxidation processes used to form thermal oxides. In the present invention, $D_2O$, DCl, and deuterated TCA are substituted for the respective hydrogen analogs otherwise used during wet oxidation processing.

In one preferred embodiment, a pyrogenic water system is used for the wet oxidation process to the form the gate oxide. In this regard, oxygen and deuterium, instead of the other conventional co-reactant, i.e., hydrogen, are directly fed to a diffusion tube, e.g., quartz or pure silicon, in which the wafer is maintained at a temperature of between 700 to 1000° C., where the gases react to form a vapor of deuterium oxide ($D_2O$), i.e., heavy water vapor, which is the source of the water for the oxidation process. For instance, an $O_2$ flow rate of about 6 sLm (standard liters per minute) and a $D_2$ flow rate of about 3.6 sLm can used for a duration sufficient to form an oxide film thickness of about 30 Å to about 200 Å with 0–9% DCl equivalent.

During the growth of the gate oxide film on silicon during the wet oxidation process, the deuterium accumulates in the gate oxide as the film is being formed on the silicon substrate. This in situ incorporation of the deuterium during gate oxide formation provides a robust silicon dioxide and silicon/silicon dioxide interface which is more resistant to hot electron effects.

The level of deuterium incorporation needed to prevent premature device failure from hot electron effects in the gate oxide, or other semiconductor layers, can be empirically determined by one skilled in the art. That is, although, ideally, it would be most preferred to use deuterated analogs for every hydrogenated reaction species and/or system atmospheric gas employed during the semiconductor device fabrication, economic and supply availability constraints may prevent such a scenario from being feasible. Therefore, blends of deuterium and hydrogen reactants and gases are also contemplated as long as care is taken to use sufficient deuterated reactants to achieve the inventive objects described herein. Also, not only the gate oxide, but also sidewall spacer films, polysilicon gates, barrier silicon nitride barriers (if present), and oxide passivation films, found in MOSFET devices which otherwise can also contain significant fractions of hydrogen which can be released into the underlying oxide during back-end-of-line (BEOL) anneals, such as the contact or a liner anneal conducted at 550–600° C. Thus, other films that advantageously can be formed using deuterium analogs in place of their conventional hydrogen containing reactants and/or dilutants used in film formation are illustrated below.

For example, gate polysilicon 15 can be formed in a deuterated state by CVD methods in which conventional hydrogen reactants are replaced by their deuterium analogs. Growth of polysilicon films by LPCVD by decomposition of $SiH_4$, as optionally diluted sometimes with $H_2$ for reasons of safety, is known in the field. However, in the present invention, gate polysilicon 15 can be formed by LPCVD in which $SiD_4$ is substituted for silane ($SiH_4$), and $D_2$ is substituted for any $H_2$ dilutant carrier gas, used in forming the polycrystalline silicon (polysilicon). Growth of the polysilicon gate using such CVD processing can be carried out at a system temperature of from about 550 to 650° C., at a system pressure of 150 mTorr, using a source gas of 350 sccm $SiD_4$ and 50 sccm $D_2$, in which the growth provides a film thickness of about 1000 to 4000 Å.

A sidewall thermal oxide 16 for gate 15 can be formed by substitution of DCl for HCl or deuterated TCA for conventional TCA. For instance, growth of the sidewall thermal oxide can be accomplished by CVD using a system temperature of 650–900° C., an $O_2$ flow rate of 15 sLm, deuterated-TCA, at a source temperature of 20–30° C., in an $N_2$ carrier gas at a flow rate of 0.1 to 1.2 sccm, to provide a film thickness of about 60 to 3000 Å, depending on the device design. Alternatively, conventional oxidation of silane ($SiH_4$) in the presence of an oxidant such as $O_2$ or $N_2O$ in APCVD and LPCVD systems can be modified to instead use $SiD_4$ in place of the silane to grow deuterated sidewall silica films. Also, deuterated sidewall silica can be grown by PECVD by the reaction of $SiD_4/O_2$, $SiD_4/CO_2$ and $SiD_4/N_2O$ mixtures. Also, an oxide spacer 16 can be formed by decomposition of deuterated TEOS, by either CVD or plasma-enhanced CVD.

A deuterated sidewall silicon nitride spacer 16 can be formed by CVD by substitution of $ND_3$ for ammonia and $SiD_4$ for silane in the CVD process. Silicon nitride, in its stoichiometric form, has a composition given by $Si_3N_4$, although it is understood in the field that considerable departure from stoichiometry is often encountered in deposited silicon nitride films such that they sometimes are referred to merely as "SiN" films for this reason.

The source/drain regions 12/13 are formed by conventional ion implantation methods. According to conventional techniques, the oxide (or nitride) spacer layer 16, as formed in the step described immediately above, is removed anisotropically at locations at the source and drain regions 12/13 leaving oxide (or nitride) sidewalls 16 on the polysilicon gate 15. A self-aligned silicide layer 17 is then formed on the polysilicon gate 15 and the source/drain regions 12/13 by conventional techniques. Metal is deposited following an in-situ surface cleaning and a silicide is formed by annealing, such as by rapid thermal anneal (RTA). During RTA, it is preferable that any hydrogen used be replaced by deuterium. After annealing, unreacted metal is removed by selective etch to leave self-aligned silicide 17 at the gate source/drain regions 12/13 and on the gate 15. The type of self-aligned silicide 17 is not necessarily limited, and it can be conventional silicide materials such as PtSi, $Pd_2Si$, $COSi_2$ and so forth. Those of skill in the art will be quite familiar with such steps used to form a self-aligned silicide in a field effect transistor and further details or illustrations thereof should not be necessary for its understanding.

In this first embodiment, the barrier silicon nitride layer 18 can optionally be deuterated. For example, barrier nitride layer 28 be formed by CVD with substitution of $ND_3$ for ammonia and $SiD_4$ for silane. The deuterated barrier nitride blocks subsequent diffusion of hydrogen from overlying layers into the device 10. Growth of the barrier nitride layer 18 can be carried out at a system temperature of from about 350 to 500° C., using a $ND_3$ flow rate of 15 sccm, a $SiD_4$ flow rate of 60 sccm, and a $N_2$ flow rate of 4000 sccm, at a system pressure of 5 Torr, to provide a film thickness of ranging from about 700 to about 1000 Å.

Oxide passivation film 19 is then formed on the device. The oxide passivation film 19 can be doped or undoped silicon oxide. For example, oxide passivation film 19 can be formed by decomposition of deuterated-TEOS to form deuterated silicon dioxide. Alternatively, oxide passivation film 19 can be formed by decomposition of deuterated-TEOS in the presence of a phosphine, diborane, or arsine dopant (i.e., P, B, or As-hydride) to form, for example, deuterated-PSG, BPSG, or AsSG. Provision of a deuterated oxide passivation layer 19 is especially useful for technologies that do not have a barrier silicon nitride layer.

Oxide passivation layer 19 forms an insulation layer between the polysilicon gate 15 and standard top metallization (not shown). Growth of the silicon oxide passivation film 19 can be carried out at a system temperature of from about 300 to about 500° C., using a helium flow rate of 560 sccm through an ampule of deuterated-TEOS, and the TEOS vapors are combined with a flow rate of 800 sccm $O_2$, at a system pressure 5 to 20 Torr, to provide a film thickness of about approximately 1 micrometer.

Oxide passivation film 19 also could be deposited as deuterated-PSG, BPSG or AsSG by including phosphine, diborane, or arsine as dopant in the same basic reaction system described above for forming the oxide passivation film 19. The doped varieties of oxide passivation film 19 can be desirable where superior reflow properties are needed. Although not required, the phosphine, diborane, or arsine dopants themselves could be deuterated (i.e., the hydrogen atoms are replaced by deuterium in the molecules) to further refine the result.

The oxide passivation film 19 also could be formed by co-oxidation of $SiD_4$ and $PH_3$ (phosphine) with $O_2$. Deuterated BPSG films also could be grown by CVD methods using the co-oxidation of $SiD_4$, $B_2H_6$ or $B_2D_6$, and $PH_3$ or $PD_3$, with $O_2$ and $N_2O$, in a nitrogen carrier gas.

The processing used in the present invention avoids the production of copious amounts of hydrogen, which otherwise would be present in the ambients if non-deuterated reactants were used, which hydrogen would tend to diffuse into the gate oxides and displace some or all of any deuterium that was left there in an earlier anneal.

In a second embodiment of this invention, a method is provided as an alternative to deuterating in situ the films during their formation, such as the gate oxide. Instead, deuteration is effected by a post-anneal treatment and then the device is sealed with a deuterium reservoir and/or barrier layer. This method can reduce fabrication costs significantly as deuterated materials are inherently more expensive than hydrogenated materials, and this embodiment effectively reduces the number of process steps requiring use of deuterated chemical species. The second embodiment of the invention has two different variants described below.

Figure 2:
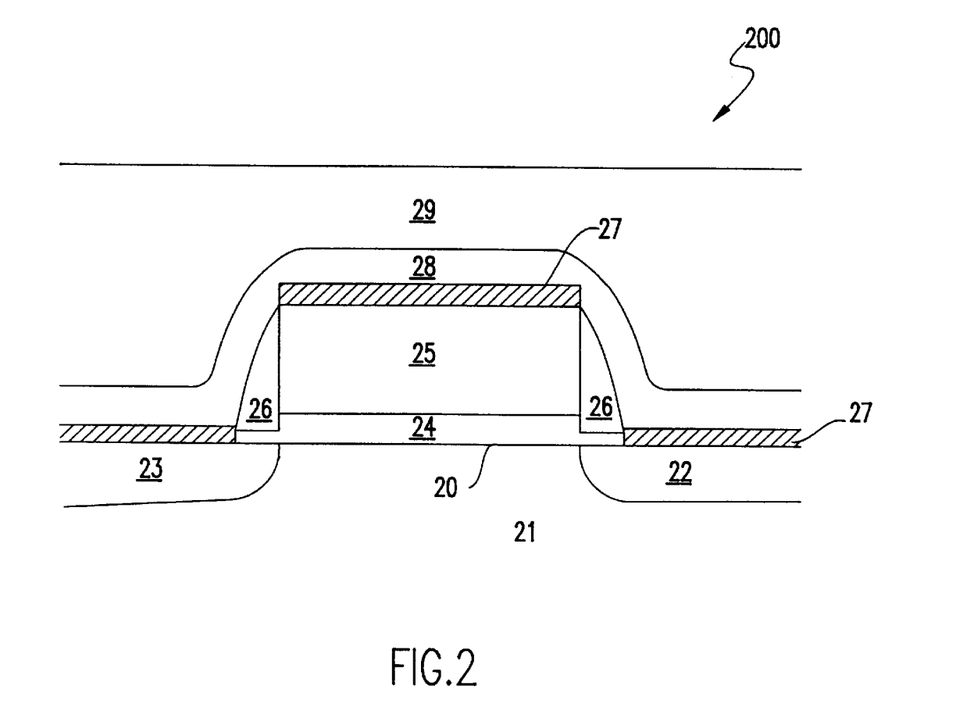
FIG. 2 illustrates in cross-sectional view of a MOSFET device having various deuterated films incorporated therein according to another embodiment of the present invention.

In the first variant shown in FIG. 2, the basic concept is to start with a device structure 200 having films formed using the standard hydrogenated reactant materials for each respective film. That is, gate oxide 24, gate 25 and gate sidewall spacers 26 are formed on silicon substrate by conventional techniques. Source/drain regions 22/23 are formed by conventional ion implantation methods. A self-aligned silicide 27 is then formed on the gate 25 and at source/drain regions 22/23.

Then, a deuterium ambient anneal is performed to deuterate the previously formed gate oxide 24, gate 25, and gate sidewall spacers 26, and so forth. This deuterium anneal is conducted at 400 to 600° C. in an ambient of $D_2$ in an otherwise conventional anneal furnace arrangement. The deuterium anneal is used to satisfy dangling bonds and/or replace (exchange) as much hydrogen as possible at the silicon/silicon dioxide interface 20 and in the nearby device films, such as gate oxide layer 24, polysilicon 25, and sidewall spacer 26. This anneal of the wafer is typically done at the end of the entire FEOL process but before the deuterium reservoir/barrier layer 28 is deposited on the gate 25. In a subsequent treatment step, deuterated barrier nitride 28 is grown on the device.

To accomplish this, the single deuterated barrier/reservoir layer 28 can be formed in the same manners as described above for deuterated nitride layer 18 of the first embodiment. The layer 28 forms a reservoir of high deuterium concentration on the layers previously deuterated by the deuterium anneal.

Figure 3:
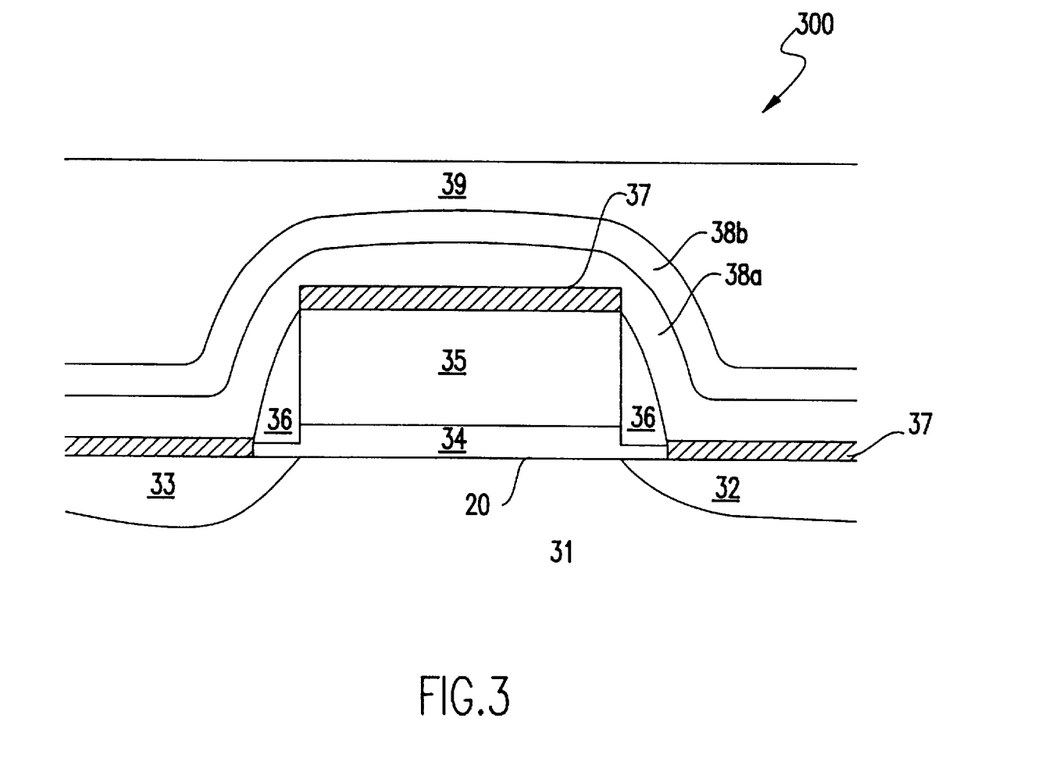
FIG. 3 illustrates in cross-sectional view of a MOSFET device having various deuterated films incorporated therein according to yet another embodiment of the present invention.

In a second variant of the second embodiment, as shown in FIG. 3, a deuterium reservoir layer 38a, which is formed in the same manner as above deuterated barrier nitride layers 18/28 having a high deuterium concentration, is provided and used in conjunction with an overlying and separate diffusion barrier layer 38b, having a low hydrogen and deuterium concentration, which inhibits hydrogen/deuterium migrations. In FIG. 3, there is also shown silicon substrate 31, source/drain regions 32/33, gate oxide 34, gate polysilicon 35, gate sidewall spacers 36, and silicide 37. In this second embodiment of the invention, gate oxide 34, gate polysilicon 35, and gate sidewall spacers 36 are deposited by conventional methods without using deuterated reactants at that time.

The diffusion barrier layer 38b can be formed as a jet vapor deposited (JVD) nitride, such as by methodology described in X. W. Wang et al., *The Japanese Society of Applied Physics*, "Highly Reliable Silicon Nitride Films Made by Jet Vapor Deposition," reprinted from Extended Abstracts of the 1994 Inter. Conf. on Solid State Devices and Materials, Aug. 23–26, 1994, Pacifico Yokohama, Japan, pp. 856–858, which descriptions are incorporated herein by reference. Alternatively, diffusion barrier layer 38b can be formed as a low hydrogen content nitride made with nitrogen and silane instead of ammonia and silane.

The deuterium reservoir film 38a and diffusion barrier layer 38b combination together act to dilute the effect that any remaining hydrogen present in the device may have and effectively "seals in" the beneficial effects of the incorporated deuterium and allows further thermal anneals and processing in hydrogen to take place in the back-end-of-line (BEOL) processing of the device 300 without exchanging the deuterium with hydrogen. The passivation oxide 39 can then be deposited on top of the deuterated barrier film 38a and diffusion barrier film 38b, and it need not be deuterated.

The present investigators have confirmed by SIMS that a conventional nitride barrier layer formation process is a source of hydrogen by virtue of the $SiH_4$ and $NH_3$ reactant used. The problem is that the hydrogen introduced via $SiH_4$ and $NH_3$ during the nitride process replaces the deuterium accumulated at the silicon/silicon dioxide interfaces during the prior post-metal anneal process with hydrogen. Thus, this embodiment involves performing not only a post-metal process deuterium anneal for passivation, but follows up by using deuterated reactants to form deuterated barrier nitrides to preserve the benefits of that anneal.

In another further refinement of this invention that is applicable to either to first or second embodiments as described above, low temperature processing, viz., processing below 400° C., is employed after any and all deuterium incorporating steps to help keep the deuterium at the silicon/silicon dioxide interface. The avoidance of thermal disturbances in the device in this manner reduces the incidence of hydrogen for deuterium replacement. For example, as applied to the second embodiment of this invention, anneals performed after either deposition of the deuterium reservoir nitride layer 28 as used without an accompanying diffusion barrier layer, or after deposition of both a deuterium reservoir nitride layer 38a and a diffusion barrier layer 39b, would be performed below a temperature of 400° C. Such anneals to be conducted below a temperature of 400° C. could be post-metallization anneals. Also, a conventional densification anneal that commonly is performed on the oxide passivation layer, such as layer 39 in FIG. 3, would be omitted altogether in this refinement, as they conventionally must be conducted at temperatures exceeding 400° C.

This invention is not particularly limited to only the examples mentioned above, but instead covers a number of occasions to use its principles depending on the details of the process integration in a particular technology. This invention can be practiced in any situation where deuterated materials are being used specifically to either preserve the effects of separate deuterium anneals or to produce deuterium reservoirs, instead of hydrogen reservoirs, to provide this effect following subsequent heat cycles This invention is also contemplated for application in TFTs, polyresistors and polyemitter bipolars. In the first two cases, deuterium serves to passivate the grain boundaries and provide greater resistance to hot electron stresses. In the latter case, deuterium is less likely than hydrogen to drift through the poly and into the bipolar junction where it could de-activate boron. Also, the degradation of the oxide over the emitter-base junction by reverse-biased current will be suppressed.

While the invention has been described in terms of its preferred embodiments, those skilled in the art will recognize that the invention can be practiced with modification within the spirit and scope of the appended claims.

What is claimed is:

1. A method of forming a semiconductor structure comprising the steps of
    a) providing a semiconductor;
    b) providing a gate oxide having a high concentration of deuterium at an interface of said gate oxide with said semiconductor;
    c) forming a deuterium reservoir film on said semiconductor;
    d) after forming said deuterium reservoir film, forming a barrier layer over said deuterium reservoir layer, wherein said barrier layer is a barrier to the diffusion of hydrogen and deuterium.

2. The method as recited in claim 1, wherein, after forming said barrier layer, performing all subsequent processing that uses hydrogen containing material at a temperature at or below 400° C. to reduce replacement of said deuterium with said hydrogen.

3. The method as recited in claim 1, wherein said reservoir forming step (c) comprises depositing from a source material comprising a deuterated species.

4. The method as recited in claim 3, wherein said reservoir film comprises deuterated silicon nitride having a high deuterium concentration.

5. The method as recited in claim 1, wherein said barrier forming step (d) comprises the step of providing a source material comprising a deuterated species during formation of said barrier layer.

6. The method as recited in claim 5, wherein said barrier layer comprises deuterated silicon nitride having a low deuterium and a low hydrogen concentration.

7. The method as recited in claim 5, wherein said barrier layer forming step comprises the step of jet vapor depositing nitride.

8. A method of forming a semiconductor structure comprising the steps of:
    a) providing a semiconductor;
    b) providing a gate oxide having a high concentration of deuterium at an interface of said gate oxide with said semiconductor;
    c) forming a deuterium reservoir film on said semiconductor;
    d) after forming said deuterium reservoir film on said semiconductor, performing all subsequent processing that uses hydrogen containing material at a temperature at or below 400° C. to reduce replacement of said deuterium with said hydrogen.

9. The method as recited in claim 8, wherein said reservoir forming step (c) comprises depositing from a source material comprising a deuterated species.

10. The method as recited in claim 9, wherein said reservoir film comprises deuterated silicon nitride having a high deuterium concentration.

11. The method as recited in claim 8, further comprising the step of forming a separate layer that is a barrier to the diffusion of hydrogen and deuterium.

12. The method as recited in claim 11, wherein said barrier forming step comprises the step of providing a source material comprising a deuterated species during formation of said barrier layer.

13. The method as recited in claim 12, wherein said barrier layer comprises deuterated silicon nitride having a low deuterium and a low hydrogen concentration.

14. The method as recited in claim 12, wherein said barrier layer forming step comprises the step of jet vapor depositing nitride.

15. The structure as recited in claim 8, wherein said film is a sidewall spacer.

16. The structure as recited in claim 8, wherein said film comprises a material to insulate one conductor from another.

17. The structure as recited in claim 16, wherein said film comprises oxide.

18. The structure as recited in claim 16, wherein said film comprises nitride.

19. The structure as recited in claim 8, wherein said film comprises silicon.

20. The structure as recited in claim 19, wherein said film comprises polysilicon.

21. The structure as recited in claim 19, wherein said film comprises a silicide.

22. The structure as recited in claim 8, wherein said structure comprises a MOSFET, a TFT, a polysilicon resistor, or a bipolar device.

23. The method as in claim 8, wherein said film is silicon dioxide formed on a silicon substrate by pyrogenic wet oxidation wherein said deuterated species includes deuterium oxide.

24. The method as in claim 8, wherein said film is selected from the group consisting of a gate oxide, a polysilicon gate, a gate sidewall spacer, a barrier nitride layer, and a PSG layer.

25. The method of claim 8, wherein said deuterated film is formed on a silicon substrate.

26. A method of for making a MOSFET device having enhanced resistance to hot electron effects, comprising the steps of:
   a) providing an intermediate semiconductor device comprising a silicon substrate, a conductive gate on said silicon substrate, and a gate oxide provided between said silicon substrate and said gate;
   b) annealing the semiconductor device at a temperature ranging from about 400 to 600° C. in a deuterium containing ambient;
   c) forming a reservoir and barrier nitride film containing deuterium on said annealed semiconductor device; and
   d) forming a hydrogen and deuterium diffusion barrier nitride layer on said deuterium reservoir and barrier nitride film.

27. The method as in claim 26, wherein said step of forming the reservoir and barrier nitride film comprises performing plasma enhanced chemical vapor deposition on said FET device in an ambient containing $SiD_4$ and $ND_3$.

28. The method of claim 26, wherein said hydrogen and deuterium diffusion barrier nitride layer is formed by jet vapor deposition.

29. A method of forming a semiconductor device comprising the steps of:
   a) providing a source material comprising a deuterated species during formation of a film on a silicon substrate; and
   b) performing processing steps after said providing step, wherein said processing steps use hydrogen containing material and wherein said processing steps are adequate to complete the semiconductor device, wherein said processing steps each are conducted at a temperature less than 400° C.

30. The method of claim 29, wherein said processing steps include at least one annealing process.

31. The method of claim 29, wherein said processing steps include at least one annealing process conducted in a deuterium containing ambient.

32. The method of claim 29, wherein said semiconductor device is an FET device.

33. The method of claim 29, further comprising the step of providing a diffusion barrier layer before performing said processing steps at a temperature less than 400 C.

34. A semiconductor structure, comprising a semiconductor, a film comprising deuterium for passivating said semiconductor, and a barrier film for containing said deuterium, wherein said barrier film is the film comprising deuterium.

35. The structure as recited in claim 34, wherein said barrier comprises nitride.

* * * * *